United States Patent [19]

Marino

[11] 4,155,044
[45] May 15, 1979

[54] VARIABLE MODE COUNTER

[75] Inventor: Francis C. Marino, Dix Hills, N.Y.

[73] Assignee: Burroughs Corporation, Detroit, Mich.

[21] Appl. No.: 891,452

[22] Filed: Mar. 29, 1978

Related U.S. Application Data

[62] Division of Ser. No. 702,538, Jul. 6, 1976, Pat. No. 4,107,664.

[51] Int. Cl.² .................. H03K 21/36; H03K 21/02
[52] U.S. Cl. ........................................ 328/46; 328/48
[58] Field of Search ................... 328/46, 48, 41, 42

[56] References Cited

U.S. PATENT DOCUMENTS 3,341,693 9/1967 Hurst .............................. 328/46 X
3,971,959 7/1976 Flournoy .......................... 328/46 X Primary Examiner—John S. Heyman
Attorney, Agent, or Firm—Hane, Roberts, Spiecens & Cohen

[57] ABSTRACT

A variable mode counter has a control means switchable between first and second states, a source of periodically occurring step signals, a counter means, and incrementing means under the control of the control means for incrementing the count in said counter means by one for each of the periodically occurring step signals when the control means is in the first state and for incrementing the count in the counter means by two for each of the periodically occurring step signals when said control means is in said second state. There are also included initializing means for clearing the counter means to a first count when the control means is in the first state and alternatively to the first count or to a second count when said control means is in the second state whereby the counter means counts by odd numbers or even numbers.

4 Claims, 2 Drawing Figures

VARIABLE MODE COUNTER

CROSS REFERENCE TO RELATED APPLICATIONS

This application is a division of my copending application Ser. No. 702,538, filed July 6, 1976 now U.S. Pat. No. 4,107,664.

BACKGROUND OF THE INVENTION

This invention pertains to counters which can be incremented by different values. In the above-cited application there is disclosed a system for displaying lines of text on a horizontal raster-scanned cathode-ray display. The lines of text are stored in a memory and are called as need. The system can display such characters in a normal mode or a magnified mode when the characters are displayed at twice the height of the normal mode. This is accomplished by switching the raster between sequential and interlaced modes. Such a technique can utilize a counter which can be switched between unit incrementing and double incrementing. Such counters are known from U.S. Pat. No. 3,742,482. However, when such systems are in the interlaced mode, the counter should count in one field by odd numbers and in another field by even numbers.

SUMMARY OF THE INVENTION

Briefly, the invention contemplates a variable mode counter having in combination a control means switchable between first and second states, a source of periodically occurring step signals, a counter means, incrementing means under the control of the control means for incrementing the count in said counter means by one for each of said periodically occurring step signals when the control means is in said first state and for incrementing the count in said counter means by two for each of the periodically occurring step signals when said control means is in the second state. Initializing means clear the counter means to a first count when the control means is in the first state or alternatively to the first count or to a second count when the control means is in the second state.

BRIEF DESCRIPTION OF THE DRAWING

The objects, advantages and features of the invention will be apparent from the following detailed description when read with the accompanying drawing which shows the presently preferred embodiment of the invention. In the drawing.

DESCRIPTION OF THE PREFERRED EMBODIMENT

Figure 1:
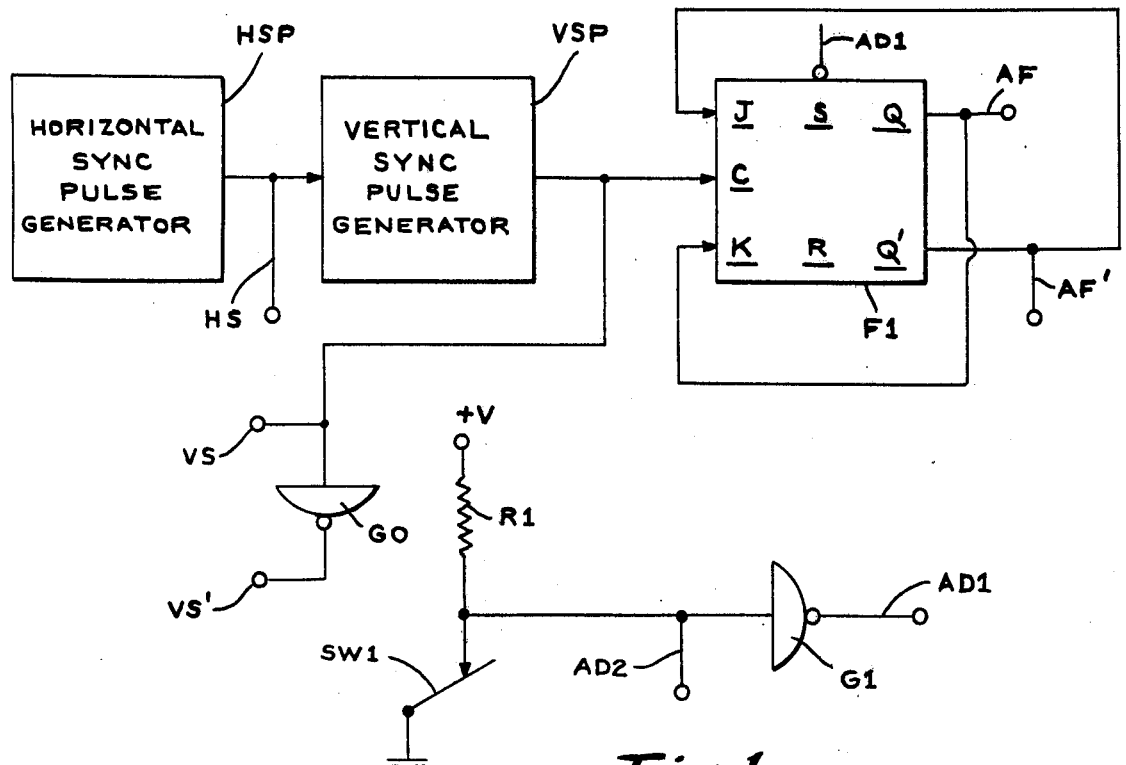
FIG. 1 shows a portion of a display system utilizing the invention.
Figure 2:
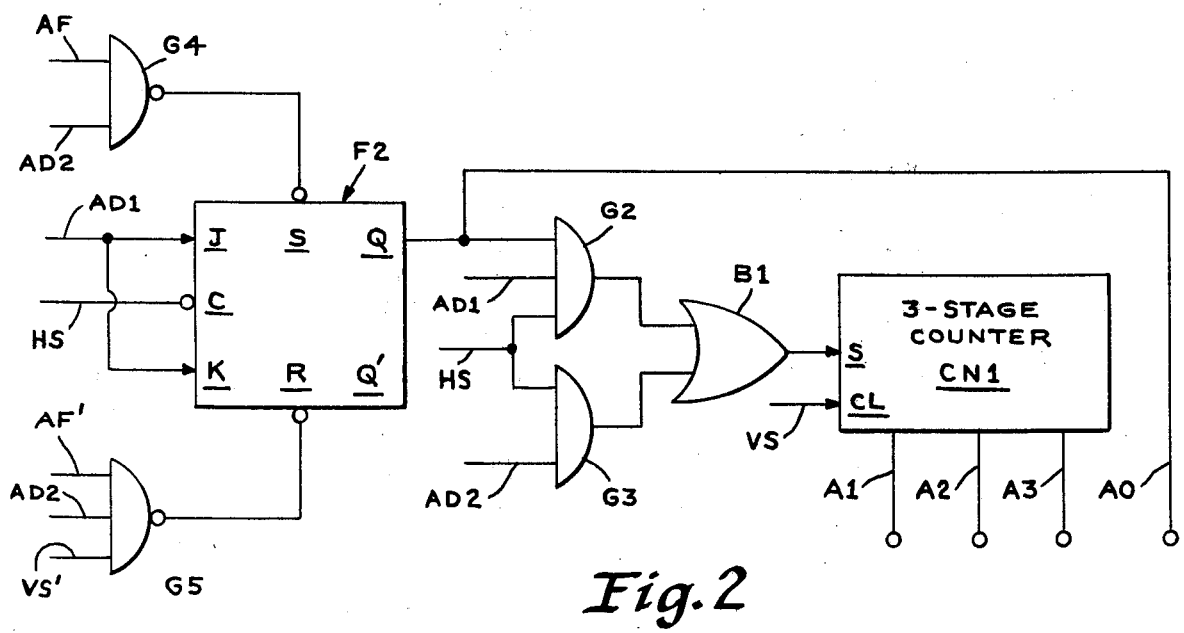
FIG. 2 shows a dual mode counter according to the invention.

In the FIG. 1 the variable mode counter is shown incorporated with portions of a display system. However, it should be understood, that the invention is not directed to such a system but to the counter per se which can be used in other systems as well.

The basic clock of the system shown in the FIG. 1 is the periodically recurring pulse signals on line HS from horizontal sync pulse generator HS. In a cathode ray tube system these pulses establish the horizontal lines of the raster. These pulses are fed to a vertical sync pulse generator VSP which derives therefrom the pulses on line VS. Line VS is connected to input of NAND-circuit G0 acting as an inverter whose output is connected to line VS'. These pulses establish the fields of the raster. For the present application horizontal sync pulse generator HSP can be considered as a free-running pulse generator and vertical sync pulse generator VSP a counter which emits a pulse, say, for every four hundred pulses on line HS. More information about the making of these generators can be found in the above-referenced application.

In any event, the pulses on lines HS and VS are periodically generated with the pulses on line VS being fed to the C-input of JK flip-flop F1. The flip-flop F1 has its Q'-output fed back to its J input, and its Q-output is fed back to its K-input so that the flip-flop switches state each time a VS signal is received at its C-input. In this way the alternate fields of interlace scanning are indicated. As will hereinafter become apparent this flip-flop F1 controls whether the variable mode counter will count by odd numbers or even numbers when it is incremented by two. However, during the unit incrementing mode of the counter the AD1 signal is present at the S-input of the flip-flop forcing it in the set state with the AF signal continuously present.

Whether the variable mode counter counts by one's or two's is determined by the position of switch SW1. Switch SW1 can be a single-pole single-throw (SPST) switch SW1 whose movable contact is grounded and whose fixed contact is connected via resistor R1 to a positive voltage +V. The fixed contact is directly connected to line AD2 and, via one-input NAND-circuit G2, acting as an inverter, to line AD1. Thus when the switch is closed as shown, signal AD2 is low or absent and signal AD1 high or present.

It should be noted that in any overall system switch SW1 would be an electronic device.

The variable mode counter per se centers around a four stage binary counter which counts signal on line HS (step pulses or clock signals) and transmits signals representing the count on lines A0, A1, A2 and A3. The counter has for a first or least-significant stage the flip-flop F2 which is connected via the logic network consisting of AND-circuits G2 and G3 and OR-circuit B1 to the 3-stage binary counter CN1 constituting the three more significant stages. The AD1 signal ("add one") and the AD2 signal ("add two") control whether the counter increments by one or two for each received signal on line HS.

The counter unit-counts when the AD1 signal is present and not the AD2 signal. In such case the AD1 signal present at the J and K inputs of the flip-flop F2 causes the latter to binary count the pulses on line HS received at its C-input. The Q-output of flip-flop F2 is the A0 signal line or the least significant but of a count. The signal on line AD1 cooperates with the signal on line HS at inputs of AND-circuit G2 to effectively couple the Q-output of flip-flop F2 via OR-circuit B1 to the count input S of counter CN1 so that there is made in effect a four stage binary counter for counting the pulses on line HS. The outputs of the three stages of counter CN1 are connected to lines A1, A2 and A3 representing the three more significant bits of the row number. Note, in this case every other HS signal is received at the S-input of counter CN1.

When the counter is to count by two the signal on line AD1 is absent and the signal on line AD2 is present. Thus, the state of the flip-flop F2 is frozen and the signal on line HS received at the C-input thereof are not counted. In addition, AND-circuit G2 is blocked, decoupling the Q-output of flip-flop F2 from the S-input of counter GN1. Instead, AND-circuit G3 is opened so that every pulse on line HS is fed to the S-input of counter CN1. In effect then the line counter is incremented by two for each pulse on line HS.

When the counter is to count odd the count should start at a value of one and then be double incremented up to say a count of fifteen. When the counter is to count even the count should start at zero and then be double incremented up to say a count of sixteen. The initial one or zero is determined by the signal on line AO, i.e., the Q-output of flip-flop F2. If the flip-flop is set, then the Q-output is high as is the signal on line AO and the initial count is one. If the flip-flop is reset, then the Q-output is low as is the signal on line AO and the initial count is zero.

The flip-flop F2 is set when the signals on lines AF and AD2 are simultaneously received at the inputs of AND-circuit G4 whose output is connected to the S-input of flip-flop F2. The flip-flop is reset by the coincidence of the signals on lines AF', AD2 and VS' at the inputs of AND-circuit G4 whose output is connected to the R-input of flip-flop F2. Note the signal on line VS' is actually for an initial clear of the flip-flop at the start of each count as is the signal on line VS fed to the initializing or CL-input of counter CN1.

The outputs of the counter are connected to lines A0, A1, A2, and A3 which can be used for address selection or other such function.

During operation with the switch SW1 as shown the counter will be cleared to zero at the occurrence of each signal on line VS and will thereafter unit count in the order 0, 1, 2, 3, 4, 5 . . . When the switch is in the other position, the first signal on line VS will cause flip-flop F1 to set, generating the signal on line AF, and the counter will double-count odd, i.e., 1, 3, 5, 7, . . . The next signal on line VS will reset the flip-flop F1 to, generating the signal on line AF' and the counter will double-count even, i.e., 2, 4, 6, 8, . . .

While only one embodiment of the invention is shown and described in detail, there will now be obvious to those skilled in the art many modifications and variations satisfying many or all of the objects of the invention without departing from the spirit thereof as defined by the appended claims.

What is claimed is:

1. A variable mode counter comprising a control means having first and second states, a source of periodically occurring step signals, a counter means, incrementing means under the control of said control means for incrementing the count in said counter means by one for each of said periodically occurring step signals when said control means is in said first state and for incrementing the count in said counter means by two for each of said periodically occurring step signals when said control means is in said second state, and initializing means for clearing said counter means to a first initial count when said control means is in said first state and alternatively to said first initial count or a second initial count when said control means is in said second state.

2. The counter of claim 1 wherein the first initial count is one and said second initial count is zero.

3. The counter of claim 1 wherein said initializing means periodically clears said counter means.

4. The counter of claim 3 wherein said initializing means comprises a source of periodically recurring signals and a two-state switching means which changes state upon receipt of each of said periodically recurring signals, said bistable switching means when in a first state clearing said counter means to said first initial count and when in a second state clearing said counter means to said second initial count.

* * * * *